United States Patent
Ito

(10) Patent No.: US 10,930,616 B2
(45) Date of Patent: Feb. 23, 2021

(54) SEMICONDUCTOR MODULE, METHOD FOR MANUFACTURING SEMICONDUCTOR MODULE, AND POWER CONVERSION APPARATUS

(71) Applicant: Mitsubishi Electric Corporation, Chiyoda-ku (JP)

(72) Inventor: Yusaku Ito, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/486,924

(22) PCT Filed: Dec. 4, 2017

(86) PCT No.: PCT/JP2017/043423
§ 371 (c)(1),
(2) Date: Aug. 19, 2019

(87) PCT Pub. No.: WO2018/189948
PCT Pub. Date: Oct. 18, 2018

(65) Prior Publication Data
US 2020/0035639 A1 Jan. 30, 2020

(30) Foreign Application Priority Data
Apr. 12, 2017 (JP) ................. 2017-078948

(51) Int. Cl.
*H01L 23/49* (2006.01)
*H01L 23/00* (2006.01)
*H01L 23/498* (2006.01)

(52) U.S. Cl.
CPC ........ *H01L 24/49* (2013.01); *H01L 23/49838* (2013.01); *H01L 2224/48747* (2013.01);
(Continued)

(58) Field of Classification Search
CPC ........... H01L 24/49; H01L 2224/49175; H01L 2224/49176; H01L 23/12–15;
(Continued)

(56) References Cited

U.S. PATENT DOCUMENTS 4,053,864 A * 10/1977 Rodriguez ............. H01C 7/022
338/22 SD
2008/0029907 A1 * 2/2008 Koduri .................. H01L 23/645
257/784

(Continued)

FOREIGN PATENT DOCUMENTS

JP 3-245769 A 11/1991
JP 3809379 B2 8/2006
(Continued)

OTHER PUBLICATIONS

International Search Report dated Feb. 27, 2018 in PCT/JP2017/043423 filed Dec. 4, 2017.

*Primary Examiner* — Scott B Geyer
(74) *Attorney, Agent, or Firm* — Xsensus LLP

(57) ABSTRACT

A semiconductor module includes a substrate, a semiconductor element, and a wire. The semiconductor element is joined onto the substrate and has a surface electrode. Both ends of the wire are bonded to the substrate such that the wire passes over the surface electrode of the semiconductor element. The wire is electrically connected to the surface electrode.

9 Claims, 8 Drawing Sheets

(52) U.S. Cl.
CPC ............... *H01L 2224/49111* (2013.01); *H01L 2224/49175* (2013.01); *H01L 2224/73265* (2013.01); *H01L 2224/85447* (2013.01)

(58) Field of Classification Search
CPC ...... H01L 2224/491–4918; H01L 2224/48111; H01L 2224/48175–48183; H01L 2224/4813; H01L 2224/48132; H01L 2224/48157; H01L 2224/48159; H01L 2224/48227; H01L 2224/48229; H01L 2224/48491; H01L 2224/48101; H01L 2224/48151
See application file for complete search history.

(56) References Cited

U.S. PATENT DOCUMENTS

| | | | |
|---|---|---|---|
| 2011/0186885 A1* | 8/2011 | Schweighart | H01L 24/48 257/98 |
| 2011/0309496 A1* | 12/2011 | Wang | H01L 24/73 257/737 |
| 2015/0221626 A1 | 8/2015 | Motowaki et al. | |
| 2015/0249940 A1* | 9/2015 | Yang | H04W 36/04 455/436 |

FOREIGN PATENT DOCUMENTS

| | | |
|---|---|---|
| JP | 2009-171732 A | 7/2009 |
| JP | 2011-142172 A | 7/2011 |
| JP | 2015-142059 A | 8/2015 |

\* cited by examiner

SEMICONDUCTOR MODULE, METHOD FOR MANUFACTURING SEMICONDUCTOR MODULE, AND POWER CONVERSION APPARATUS

TECHNICAL FIELD

The present invention relates to a semiconductor module, a method for manufacturing a semiconductor module, and a power conversion apparatus. Particularly, the present invention relates to a power semiconductor module including a power semiconductor element, a method for manufacturing the same, and a power conversion apparatus.

BACKGROUND ART

Normally, a semiconductor module includes a substrate having a conductor pattern, a semiconductor element having a back surface joined to the conductor pattern and a front surface provided with a surface electrode, and a bonding wire joined to the surface electrode.

Some semiconductor modules are configured such that a semiconductor element and a wire are electrically connected without the wire being bonded. One example of such semiconductor modules is described in Japanese Patent No. 3809379 (PTL 1). In the semiconductor module described in PTL 1, a surface electrode arranged on a surface of a semiconductor element is covered with a protective film having an opening. In the opening of the protective film, the wire and the surface electrode are joined by solder.

CITATION LIST

Patent Literature

PTL 1: Japanese Patent No. 3809379

SUMMARY OF INVENTION

Technical Problem

In the above-described normal semiconductor module, the wire is bonded to the surface electrode, and thus, a cutout shape is formed in a joint portion where the surface electrode and the wire are joined. Therefore, at the time of temperature change caused by repeated heat generation and cooling during operation of the semiconductor module, the stress concentrates on an edge of the cutout shape in the joint portion of the wire. As a result, breakage occurs from the edge of the cutout shape. Accordingly, it is difficult to achieve a long life of the joint portion of the wire bonded to the surface electrode of the semiconductor element.

In addition, in the semiconductor module described in the patent literature above, wire bonding by ultrasonic joining is not performed, and thus, a cutout shape is not formed in a joint portion where the surface electrode and the wire are joined. However, the wire is joined to the surface electrode by solder, and thus, the number of wires is limited as compared with wire bonding. Accordingly, it is difficult to achieve a low current density per wire.

The present invention has been made in light of the above-described problems, and an object of the present invention is to provide a semiconductor module, a method for manufacturing a semiconductor module, and a power conversion apparatus, which can achieve a long life of a joint portion where a surface electrode of a semiconductor element and a wire are joined, and can achieve a low current density per wire.

Solution to Problem

A semiconductor module of the present invention includes: a substrate; a semiconductor element; and a wire. The semiconductor element is joined onto the substrate and has a surface electrode. Both ends of the wire are bonded to the substrate such that the wire passes over the surface electrode of the semiconductor element. The wire is electrically connected to the surface electrode.

Advantageous Effects of Invention

According to the semiconductor module of the present invention, the both ends of the wire are bonded to the substrate such that the wire passes over the surface electrode of the semiconductor element, and the wire is electrically connected to the surface electrode. Therefore, a cutout shape is not formed in a joint portion where the surface electrode and the wire are joined, and thus, concentration of the stress on an edge of the joint portion of the wire can be reduced. In addition, the bonding wire is used, and thus, the number of wires can be increased as compared with the case in which the wire is joined by solder. Accordingly, a long life of the joint portion where the surface electrode of the semiconductor element and the wire are joined can be achieved, and a low current density per wire can be achieved.

DESCRIPTION OF EMBODIMENTS

Figure 1:
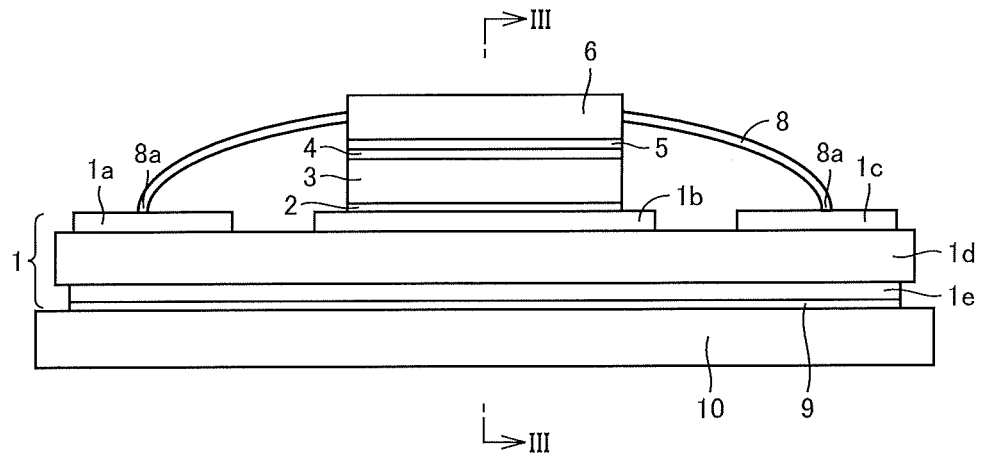
FIG. 1 is a front view schematically showing a configuration of a semiconductor module according to a first embodiment of the present invention.

Embodiments of the present invention will be described hereinafter with reference to the drawings, in which the same or corresponding portions are denoted by the same reference characters. At least a part of the embodiments described below may be arbitrarily combined.

First Embodiment

Figure 2:
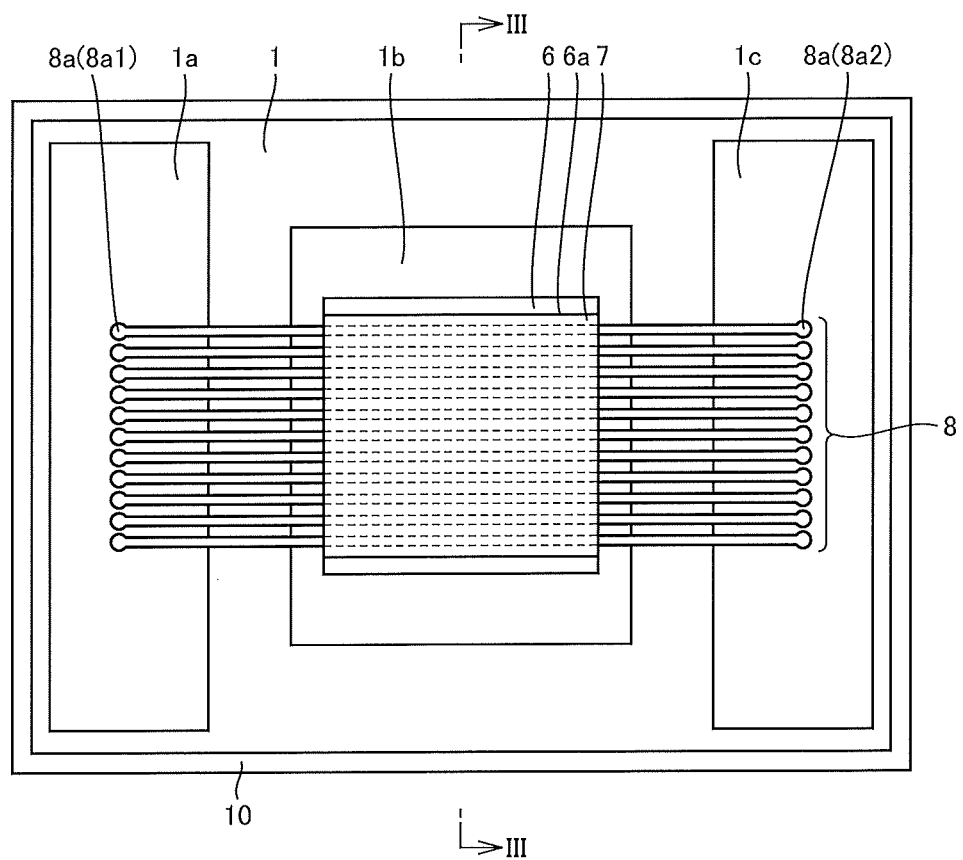
FIG. 2 is a top view schematically showing the configuration of the semiconductor module according to the first embodiment of the present invention.
Figure 3:
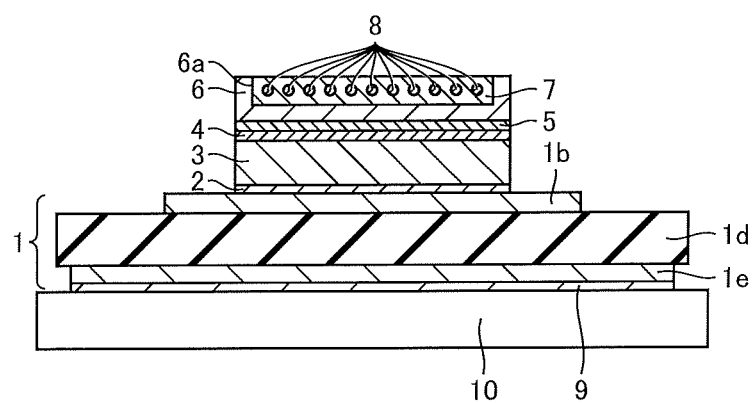
FIG. 3 is an end view taken along line III-III in FIGS. 1 and 2.

A structure of a semiconductor module according to a first embodiment of the present invention will be described with reference to FIGS. 1 to 3. FIG. 1 is a front view of the semiconductor module according to the present embodiment. FIG. 2 is a top view of the semiconductor module according to the present embodiment. FIG. 3 is an end view of the semiconductor module according to the present embodiment.

As shown in FIGS. 1, 2 and 3, the semiconductor module according to the present embodiment mainly has a substrate 1, a joining member 2, a semiconductor element 3, a joining member 5, a conductor 6, a joining member 7, and a wire 8.

Conductor patterns 1a, 1b and 1c are provided on a surface of substrate 1. Joining member 2 is for joining conductor pattern 1b of substrate 1 to semiconductor element 3. Joining member 2 has electrical conductivity. Semiconductor element 3 is joined onto substrate 1. Semiconductor element 3 has a surface electrode 4. Surface electrode 4 is provided on a surface of semiconductor element 3. Conductor 6 is joined onto surface electrode 4 of semiconductor element 3, with joining member 5 being interposed. Surface electrode 4 of semiconductor element 3 and conductor 6 do not necessarily need to be joined, with only joining member 5 being interposed. Another conductor and joining member may be interposed between surface electrode 4 of semiconductor element 3 and conductor 6.

Joining member 7 joins conductor 6 to wire 8. Both ends 8a of wire 8 are bonded to substrate 1 such that wire 8 passes over surface electrode 4 of semiconductor element 3. Wire 8 is electrically connected to surface electrode 4. Specifically, both ends 8a of wire 8 are bonded to conductor pattern 1b and conductor pattern 1c such that wire 8 bridges over semiconductor element 3. Wire 8 is electrically connected to surface electrode 4 on the upper side of surface electrode 4.

Substrate 1 has conductor patterns 1a, 1b, 1c, and 1e, and an insulating layer 1d. Conductor patterns 1a, 1b, 1c, and 1e are provided on insulating layer 1d. Specifically, in addition to conductor patterns 1a, 1b and 1c provided on a front surface, substrate 1 has insulating layer 1d, and conductor pattern 1e provided on a back surface opposite to the front surface on which semiconductor element 3 is mounted. That is, conductor patterns 1a, 1b and 1c are arranged on the front surface of insulating layer 1d, and conductor pattern 1e is arranged on the back surface of insulating layer 1d.

Semiconductor element 3 is arranged between conductor pattern (first conductor portion) 1a and conductor pattern (second conductor portion) 1c. A first end 8a1 of both ends 8a of wire 8 is bonded to conductor pattern (first conductor portion) 1a, and a second end 8a2 of both ends 8a of wire 8 is bonded to second conductor pattern (second conductor portion) 1c.

Insulating layer 1d is made of, for example, aluminum oxide ($Al_2O_3$), aluminum nitride (AlN) or the like. Conductor patterns 1a, 1b, 1c, and 1e are formed on insulating layer 1d. Conductor patterns 1a, 1b, 1c, and 1e are made of, for example, copper (Cu).

The semiconductor module according to the present embodiment has a base plate 10. Base plate 10 is made of a material having a high thermal conductivity. Base plate 10 is made of, for example, copper (Cu). An upper surface of base plate 10 is joined to conductor pattern 1e formed on the back surface of substrate 1. Conductor pattern 1e and base plate 10 are joined by a joining member 9. Joining member 9 is made of, for example, solder or sinterable silver particles.

Semiconductor element 3 is, for example, a power semiconductor element having a vertical structure in which a current flows from a lower surface (back surface) to an upper surface (front surface). Semiconductor element 3 is, for example, a switching element such as an IGBT (Insulated Gate Bipolar Transistor) or a vertical MOSFET (Metal Oxide Semiconductor Field Effect Transistor), or a rectifier element such as a schottky-barrier diode.

Semiconductor element 3 is formed by using, for example, a single crystal of silicon (Si). The semiconductor material forming semiconductor element 3 is not limited to the single crystal of silicon (Si), and may be a semiconductor material having a wide bandgap such as, for example, silicon carbide (SiC) or silicon nitride (GaN).

A lower surface of semiconductor element 3 is electrically joined to conductor pattern 1b on the front surface of substrate 1. The lower surface of semiconductor element 3 and conductor pattern 1b are joined, with joining member 2 having electrical conductivity being interposed. Joining member 2 is made of, for example, solder, sinterable silver particles or the like.

Semiconductor element 3 has surface electrode 4. Surface electrode 4 is formed on the front surface (upper surface) of semiconductor element 3. Surface electrode 4 is made of, for example, a silicon (Si)-containing aluminum (Al) alloy or the like. Surface electrode 4 may have a covering layer. The covering layer is made of, for example, nickel (Ni), gold (Au), or a structure formed by stacking these. Conductor 6 is joined onto surface electrode 4. Joining member 5 is arranged on conductor 6. Surface electrode 4 and conductor 6 are joined by joining member 5 having electrical conductivity. Joining member 5 is made of, for example, solder, sinterable silver particles or the like.

Conductor 6 is made of, for example, copper (Cu). Conductor 6 may be made of a material different from that of joining member 5. Wire 8 is joined to conductor 6 by joining member 7 having electrical conductivity. Joining member 7 is made of, for example, solder, sinterable silver particles or the like. Joining member 7 is preferably made of, for example, a silver-containing sintered material (Ag sintered material).

As shown in FIG. 3, conductor 6 may have a groove 6a which wire 8 and joining member 7 enter. Groove 6a is provided in an upper surface of conductor 6. Wire 8 and joining member 7 are arranged to enter groove 6a. Since conductor 6 has groove 6a, it is easy to put wire 8 into groove 6a and fix wire 8 by joining member 7.

One wire 8 may be used, or a plurality of wires 8 may be used. Wire 8 is joined to conductor patterns 1a and 1c. That is, one end of wire 8 is joined to conductor pattern 1a, and the other end of wire 8 is joined to conductor pattern 1c. Conductor pattern 1a and conductor pattern 1c may be different patterns, or may be one continuous pattern. In the case of the plurality of wires 8, both ends of each wire 8 do not necessarily need to be bonded to conductor pattern 1a and conductor pattern 1c, respectively. A part of wires 8 may be connected to a conductor pattern other than conductor pattern 1a and conductor pattern 1c. Wire 8 is made of, for example, gold (Au), aluminum (Al), copper (Cu) or the like.

Next, a method for manufacturing the semiconductor module according to the first embodiment of the present invention will be described with reference to FIGS. 4 to 6.

Figure 4:
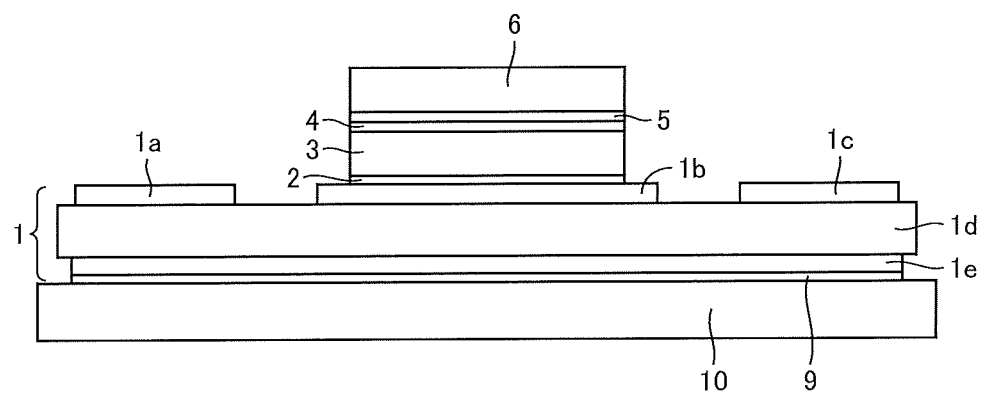
FIG. 4 is a front view schematically showing a configuration of a semiconductor module according to a second embodiment of the present invention.

As shown in FIG. 4, in the method for manufacturing the semiconductor module according to the present embodiment, semiconductor element 3 is joined by joining member 2 onto conductor pattern 1b provided on the front surface of substrate 1. Conductor 6 is joined onto surface electrode 4 of semiconductor element 3 by joining member 5.

Figure 5:
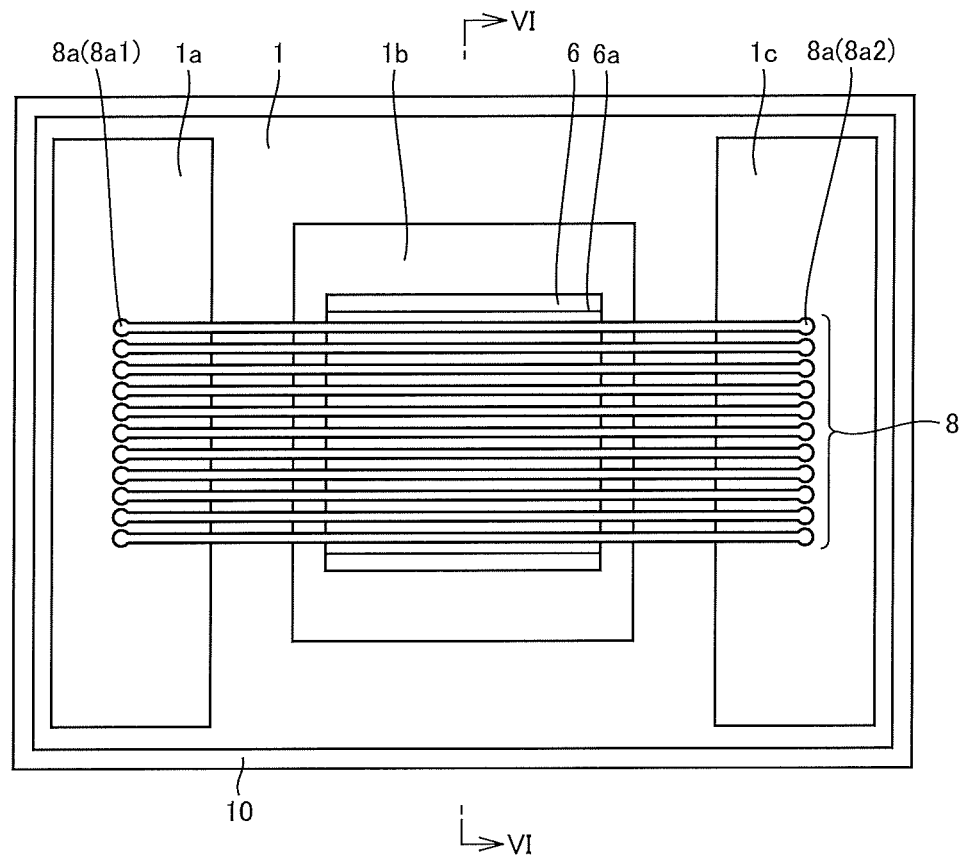
FIG. 5 is a top view schematically showing the configuration of the semiconductor module according to the second embodiment of the present invention.
Figure 6:
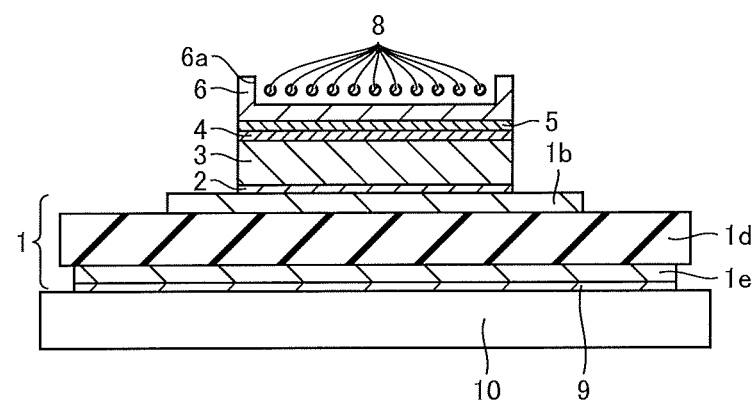
FIG. 6 is an end view taken along line VI-VI in FIG. 5.

Next, as shown in FIG. 5, both ends of wire 8 are joined to conductor patterns 1a and 1c on the front surface of substrate 1 by ultrasonic joining. Both ends 8a of wire 8 are bonded to conductor patterns 1a and 1c of substrate 1 such that wire 8 passes over surface electrode 4 of semiconductor element 3. Wire 8 bonded to conductor patterns 1a and 1c of substrate 1 is electrically connected to surface electrode 4 of semiconductor element 3.

After the both ends of wire 8 are joined to conductor patterns 1a and 1c, wire 8 may be pushed toward conductor 6 and deformed. When conductor 6 has groove 6a for housing wire 8 as shown in FIG. 6, wire 8 may be pushed into groove 6a such that wire 8 enters groove 6a of conductor 6. After wire 8 is pushed into groove 6a, conductor 6 and wire 8 are joined in groove 6a by joining member 7. Thus, the semiconductor module shown in FIGS. 1 to 3 is manufactured.

Next, an effect of the semiconductor module according to the present embodiment will be described.

As shown in FIGS. 1, 2 and 3, wire 8 is joined to conductor 6 by joining member 7 having electrical conductivity. Therefore, a current having flowed from the lower surface to surface electrode 4 in a direction vertical to semiconductor element 3 can flow through joining member 5 having electrical conductivity, conductor 6, joining member 7 having electrical conductivity, wire 8, and conductor patterns 1a and 1c in this order, for example.

At this time, if wire 8 is bonded to surface electrode 4 of semiconductor element 3 by ultrasonic joining as in the above-described normal semiconductor module, a cutout shape is formed in a joint portion where surface electrode 4 and wire 8 are joined. Therefore, at the time of temperature change caused by repeated heat generation and cooling during operation of the semiconductor module, the stress concentrates on an edge of the cutout shape in the joint portion of wire 8 and breakage occurs from the edge of the cutout shape. In other words, in the semiconductor module, the surroundings of the semiconductor element are subjected to the greatest temperature change. In the surroundings of the semiconductor element subjected to the greatest temperature change, the above-described normal semiconductor module has the wire bonding portion by ultrasonic joining where the stress concentrates. Therefore, the above-described normal semiconductor module has a problem in terms of reliability. In addition, the above-described normal semiconductor module can be easily created using a conventional wire bonding apparatus.

On the other hand, in the semiconductor module according to the present embodiment, both ends 8a of wire 8 are bonded to substrate 1 such that wire 8 passes over surface electrode 4 of semiconductor element 3, and wire 8 is electrically connected to surface electrode 4. Therefore, a cutout shape is not formed in the joint portion where surface electrode 4 and wire 8 are joined, and thus, concentration of the stress on the edge of the joint portion of wire 8 can be reduced. Accordingly, a long life of the joint portion where surface electrode 4 of semiconductor element 3 and wire 8 are joined can be achieved. In addition, the bonding wire is used as wire 8, and thus, the number of wires 8 can be increased as compared with the case in which wire 8 is joined to surface electrode 4 by solder. Therefore, a low current density per wire can be achieved. Furthermore, wire 8 is bonded to substrate 1 so as to pass over surface electrode 4, and thus, a current can flow toward the both ends of wire 8. As a result, a low current density per wire can be achieved.

In addition, in the semiconductor module according to the present embodiment, semiconductor element 3 is arranged between conductor pattern (first conductor portion) 1a and conductor pattern (second conductor portion) 1c. Therefore, wire 8 can be electrically connected to surface electrode 4 so as to pass over surface electrode 4 of semiconductor element 3. First end 8a1 of both ends 8a of wire 8 is bonded to conductor pattern 1a, and second end 8a2 of both ends 8a of wire 8 is bonded to conductor pattern 1c. Therefore, a current can flow toward each of both ends 8a of wire 8.

In addition, in the semiconductor module according to the present embodiment, wire 8 is joined by joining member 7 to conductor 6 joined onto surface electrode 4. Therefore, conductor 6 electrically linked to semiconductor element 3 and wire 8 can be joined by joining member 7, not by ultrasonic joining. Therefore, a joint portion where conductor 6 and wire 8 are joined does not have a cutout shape, and thus, a long life of the joint portion where conductor 6 and wire 8 are joined can be achieved.

When wire 8 is bonded to surface electrode 4 of semiconductor element 3 and when wire 8 is joined to surface electrode 4 of semiconductor element 3 by the joining member such as solder, a linear expansion coefficient of wire 8 is generally several times or more as high as a linear expansion coefficient of semiconductor element 3. Therefore, at the time of temperature change caused by repeated heat generation and cooling during operation of the semiconductor module, the thermal stress occurs due to a difference between the linear expansion coefficient of semiconductor element 3 and the linear expansion coefficient of wire 8. The thermal stress occurs in the vicinity of the joint surface where wire 8 is bonded to surface electrode 4 and in the joining member that joins semiconductor element 3 to wire 8, and thus, breakage is likely to occur in the joint surface and the joining member.

On the other hand, in the present embodiment, conductor 6 is interposed between semiconductor element 3 and wire 8, and thus, the thermal stress due to a difference in linear expansion coefficient between conductor 6 and wire 8 as well as the thermal stress due to a difference in linear expansion coefficient between semiconductor element 3 and conductor 6 may only be taken into consideration. Since the difference in linear expansion coefficient between conductor 6 and wire 8 is generally small, the generated thermal stress is small. Although the difference in linear expansion coefficient between semiconductor element 3 and conductor 6 is large, a cutout shape is not formed in an edge of a joint portion where semiconductor element 3 and conductor 6 are joined, and thus, the generated thermal stress can be kept low. Furthermore, a joining area of semiconductor element 3 and conductor 6 is several tens of times or more as large as an area of wire bonding, and thus, a long life of the joint portion can be achieved.

In addition, in the semiconductor module according to the present embodiment, wire 8 and joining member 7 are arranged to enter groove 6a, and thus, it is easy to put wire 8 into groove 6a and fix wire 8 by joining member 7.

In addition, in the semiconductor module according to the present embodiment, joining member 7 is a silver-containing sintered material. By using the joining member having high heat resistance and high reliability, a long life of the joint portion of wire 8 can be achieved. Therefore, the reliability of the semiconductor module can be greatly enhanced.

In addition, in the semiconductor module according to the present embodiment, wire 8 is made of copper. Therefore, the cost of the semiconductor module can be reduced.

The method for manufacturing the semiconductor module according to the present embodiment includes the following steps. Both ends 8a of wire 8 are bonded to substrate 1 such that wire 8 passes over surface electrode 4 of semiconductor element 3 joined to substrate 1. Wire 8 bonded to substrate 1 is electrically connected to surface electrode 4 of semiconductor element 3. Therefore, it is possible to manufacture the semiconductor module in which a long life of the joint portion where surface electrode 4 of semiconductor element 3 and wire 8 are joined can be achieved and a low current density per wire can be achieved.

In addition, the method for manufacturing the semiconductor module according to the present embodiment further includes the following steps. Conductor 6 including groove 6a in an upper surface is joined onto surface electrode 4. Wire 8 is pushed into groove 6a, and then, conductor 6 and wire 8 are joined in groove 6a by joining member 7 having electrical conductivity. It is easy to put wire 8 into groove 6a and fix wire 8 by joining risen member 7. In addition, as a wiring structure on a chip, a conventional wire and a conventional wire bonding apparatus can be used for wiring, without using a copper plate or the like other than the wire. Therefore, there is an advantage of easy manufacturing.

Second Embodiment

Figure 7:
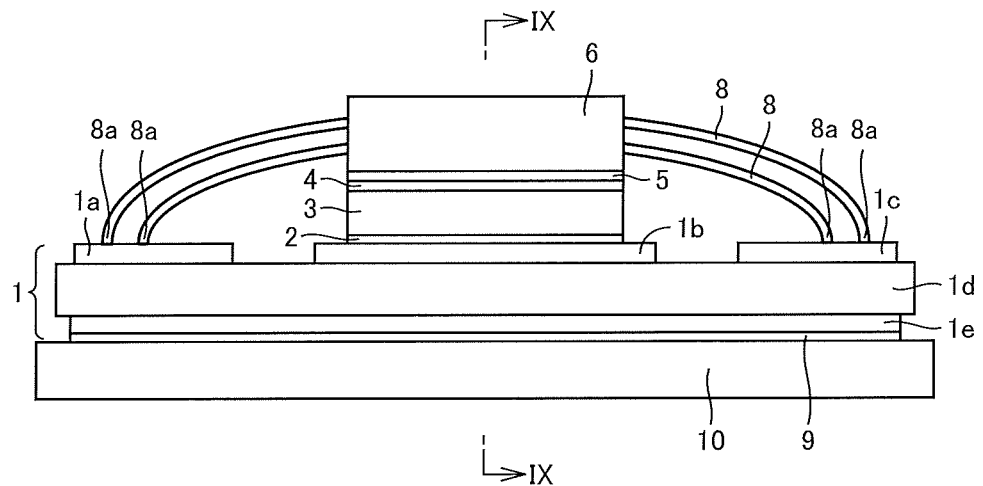
FIG. 7 is a front view schematically showing a configuration of a semiconductor module according to a first modification of the second embodiment of the present invention.
Figure 8:
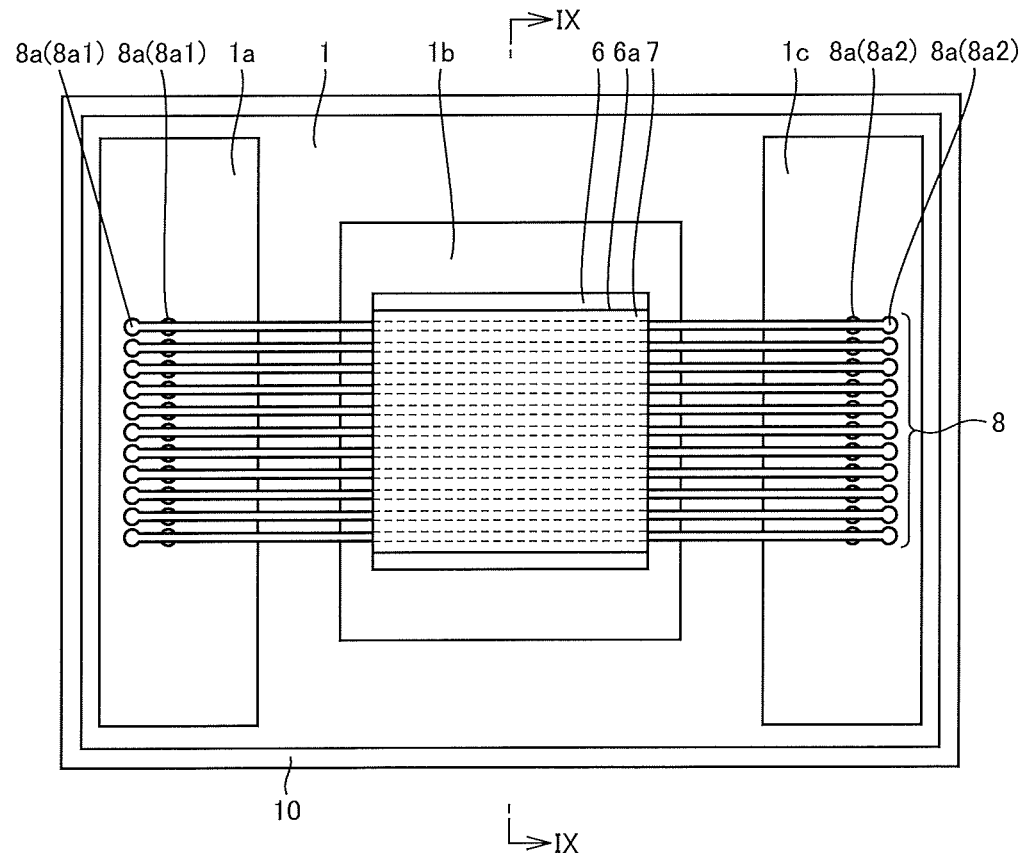
FIG. 8 is a top view schematically showing the configuration of the semiconductor module according to the first modification of the second embodiment of the present invention.
Figure 9:
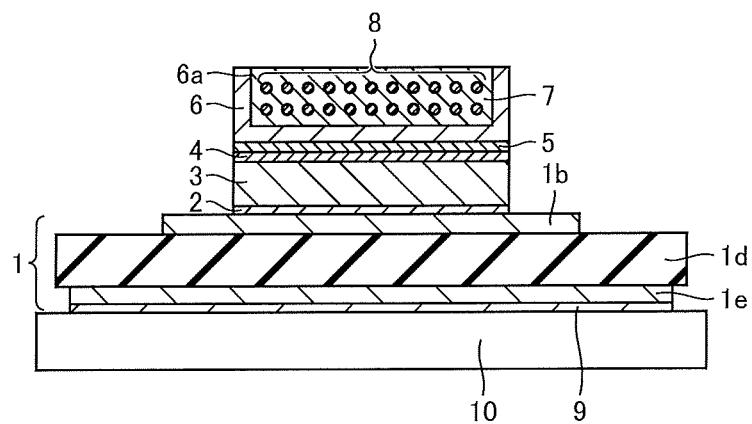
FIG. 9 is an end view taken along line IX-IX in FIG. 7.

A structure of a semiconductor module according to a second embodiment of the present invention will be described with reference to FIGS. 7 to 9. A difference from the first embodiment will be mainly described. FIG. 7 is a front view of the semiconductor module according to the present embodiment. FIG. 8 is a top view of the semiconductor module according to the present embodiment. FIG. 9 is an end view of the semiconductor module according to the present embodiment.

As shown in FIGS. 7, 8 and 9, similarly to the semiconductor module according to the first embodiment, the semiconductor module according to the present embodiment mainly has substrate 1, joining member 2, semiconductor element 3, joining member 5, conductor 6, joining member 7, and wire 8.

As shown in FIG. 8, two rows of wires 8 may be bonded side-by-side to conductor patterns 1a and 1c. In addition, as shown in FIG. 9, when wires 8 are joined in groove 6a of conductor 6, two or more tiers of wires 8 may be joined vertically.

Next, a method for manufacturing the semiconductor module according to the present embodiment will be described.

The method for manufacturing the semiconductor module according to the present embodiment is similar to the method for manufacturing the semiconductor module according to the first embodiment, and the method for manufacturing the semiconductor module according to the present embodiment is different from the method for manufacturing the semiconductor module according to the first embodiment only in that when wires 8 are bonded, two rows of wires 8 are bonded side-by-side to conductor patterns 1a and 1c. Three or more rows of wires 8 may be bonded side-by-side, and both ends 8a of wires 8 may be bonded to any position of conductor patterns 1a and 1c.

Next, an effect of the semiconductor module according to the present embodiment will be described. An effect that has not been described in the effect of the semiconductor module according to the first embodiment will now be described.

In the semiconductor module according to the present embodiment, two or more tiers of the joint portions where conductor 6 and wire 8 are joined are provided, and thus, the number of wires 8 electrically connected to one semiconductor element 3 can be arbitrarily increased without depending on a surface area of semiconductor element 3. In the semiconductor module, not only semiconductor element 3 but also heat generation caused by a loss in wires 8 is a factor of shortening of the life of the semiconductor module. In the present embodiment, the current density per wire can be reduced, and thus, a long life of the semiconductor module can be achieved.

Next, semiconductor modules according to modifications of the present embodiment will be described with reference to FIGS. 10 to 12. Unless otherwise specified, the modifications of the present embodiment are configured similarly to the above-described present embodiment, and thus, the same components will be denoted by the same reference characters and description thereof will not be repeated.

Figure 10:
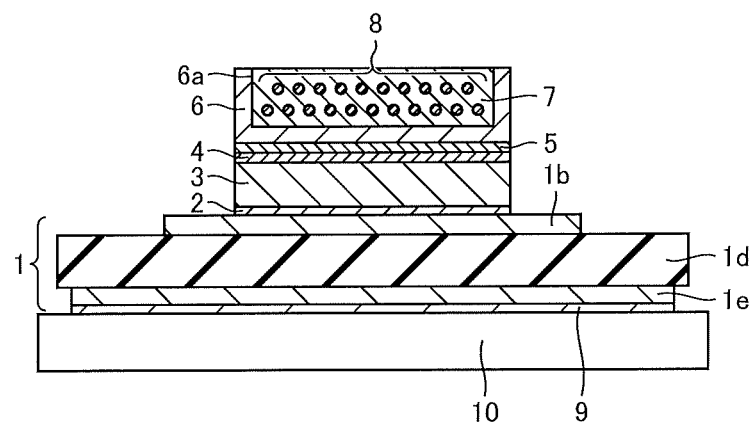
FIG. 10 is an end view schematically showing a configuration of a semiconductor module according to a second modification of the second embodiment of the present invention.

As shown in FIG. 10, in a semiconductor module according to a first modification of the present embodiment, wire 8 in a second tier is arranged between wires 8 in a first tier, and the wire in the first tier is arranged between the wires in the second tier. That is, wires 8 in the first tier and wires 8 in the second tier are arranged to fill spaces between wires 8 in the first tier and spaces between wires 8 in the second tier.

In the semiconductor module according to the first modification of the present embodiment, a distance between wires 8 in the first tier and wires 8 in the second tier in the stacking direction can be reduced. Therefore, the semiconductor module can be reduced in size.

Figure 11:
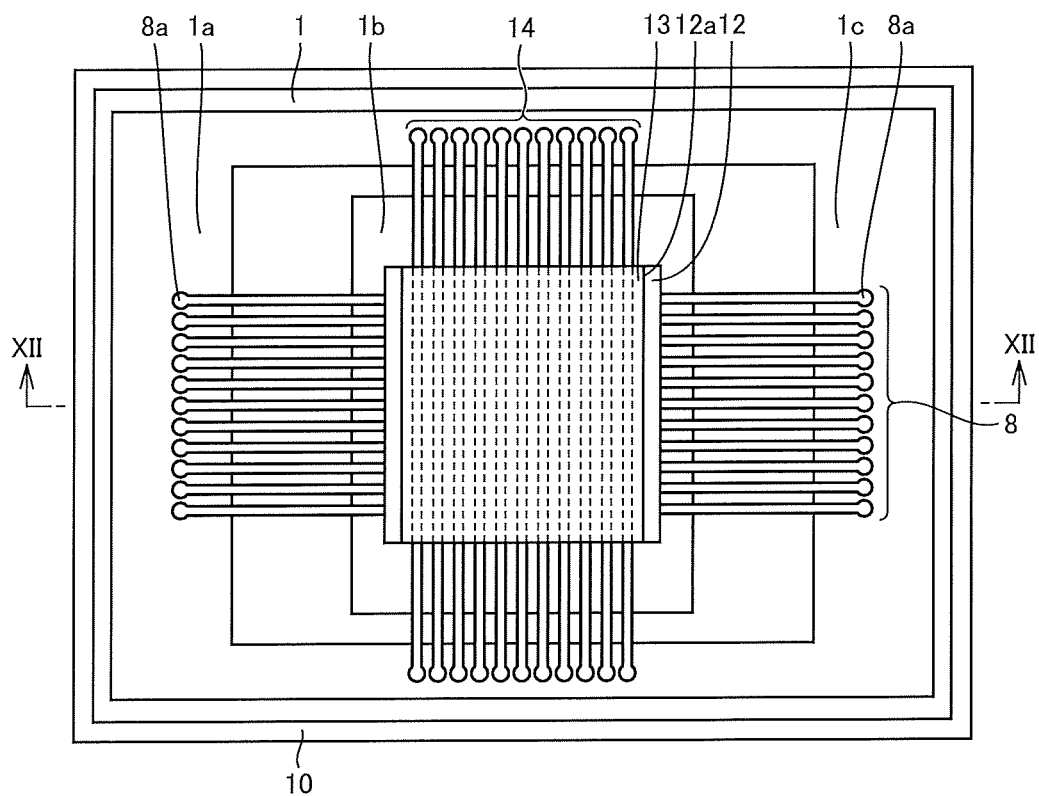
FIG. 11 is a top view schematically showing a configuration of a semiconductor module according to a third modification of the second embodiment of the present invention.
Figure 12:
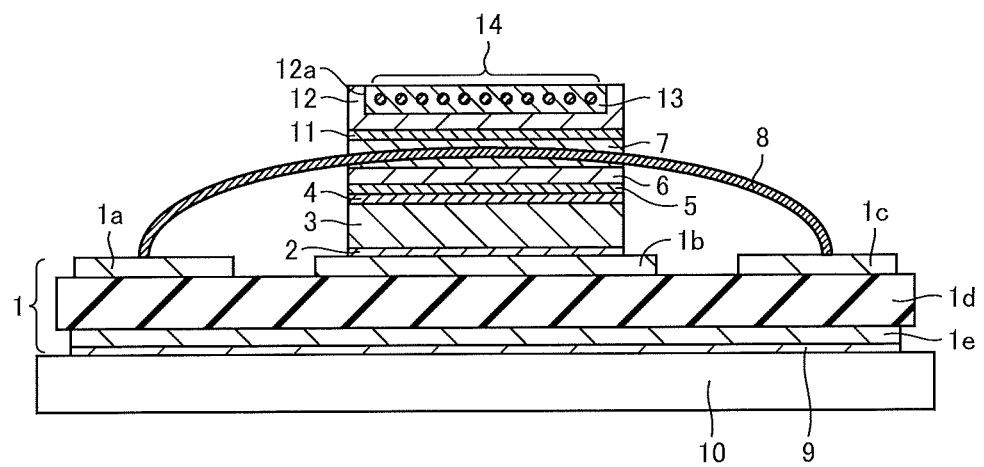
FIG. 12 is an end view taken along line XII-XII in FIG. 11.

As shown in FIGS. 11 and 12, in a semiconductor module according to a second modification of the present embodiment, a conductor 12 is further joined onto conductor 6, with a joining member 11 having electrical conductivity being interposed. Conductor 12 has a groove 12a. A wire 14 is joined in groove 12a by a joining member 13 having electrical conductivity. Wire 14 is made of, for example, gold (Au), aluminum (Al), copper (Cu) or the like. Conductor 12 is made of, for example, copper (Cu). Joining member 13 is made of, for example, solder, sinterable silver particles or the like. Wire 8 and wire 14 are arranged to pass over surface electrode 4 of semiconductor element 3 in a direction of intersecting with each other.

When two or more conductors are joined onto semiconductor element 3 by the joining members, conductor 6 and wire 8 may be first joined by joining member 7, and then, wire 14 and conductor 12 may be joined by joining member 13. Alternatively, joining member 7 and joining member 13 may be cured at the same time.

In the semiconductor module according to the second modification of the present embodiment, the direction in which wire 8 passes over surface electrode 4 of semiconductor element 3 and the direction in which wire 14 passes over surface electrode 4 of semiconductor element 3 can be made different from each other. As a result, the degree of freedom of arrangement of the wires can be enhanced.

Third Embodiment

Figure 13:
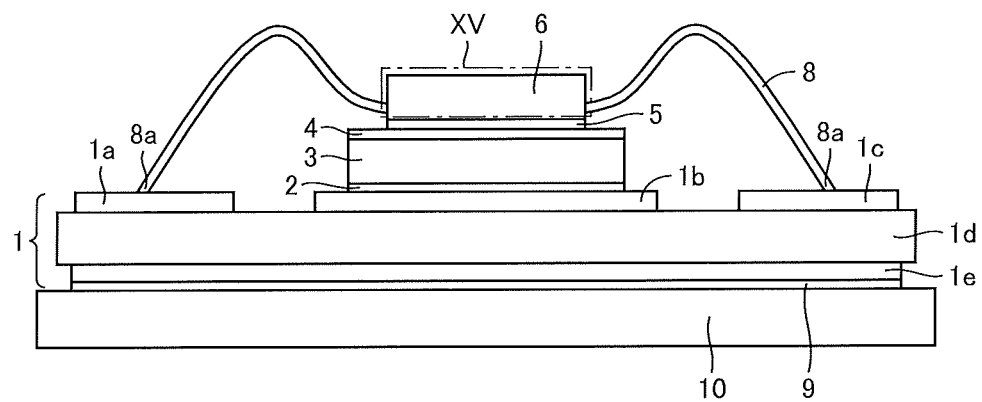
FIG. 13 is a front view schematically showing a configuration of a semiconductor module according to a third embodiment of the present invention.
Figure 14:
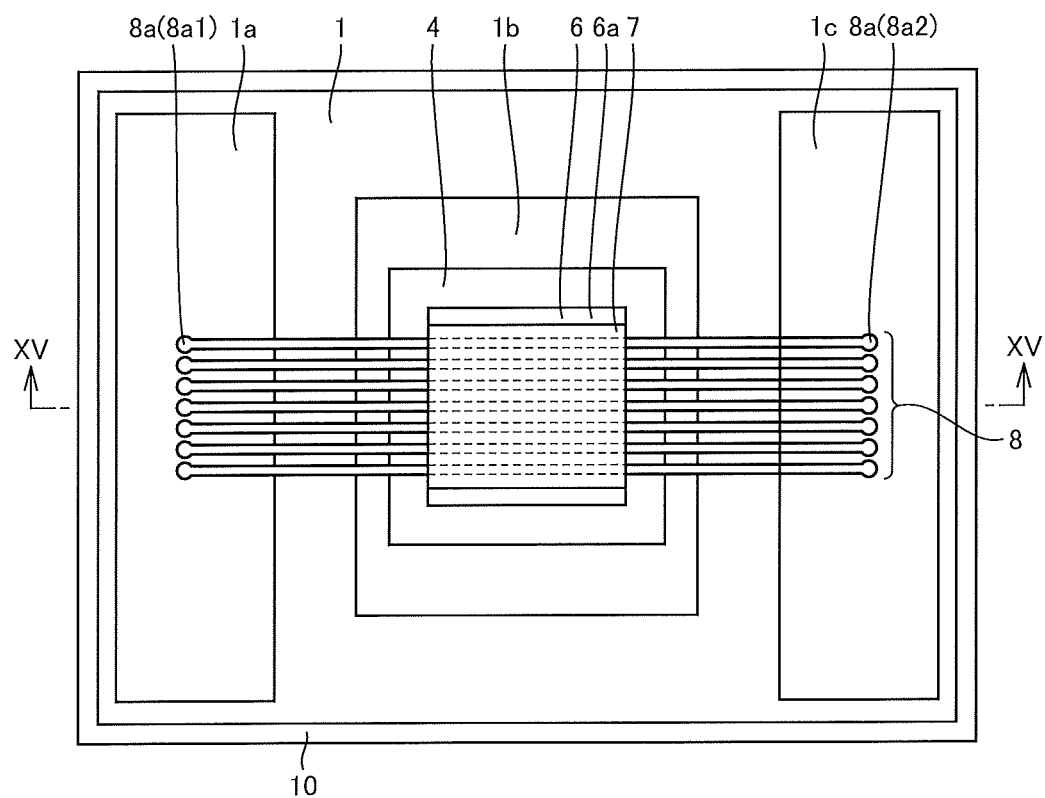
FIG. 14 is a top view schematically showing the configuration of the semiconductor module according to the third embodiment of the present invention.
Figure 15:
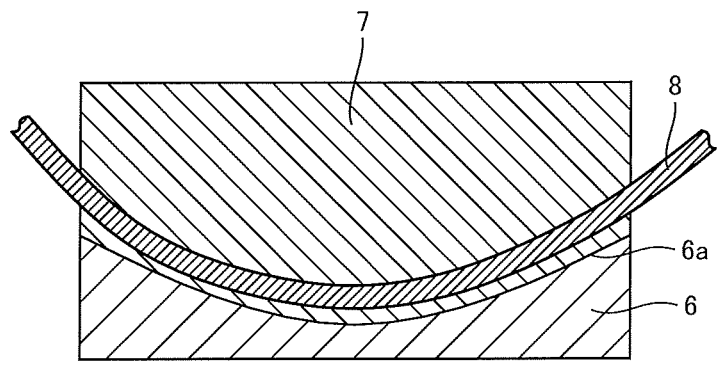
FIG. 15 is an enlarged cross-sectional view of an XV portion in FIG. 13 taken along line XV-XV in FIG. 14.

A structure of a semiconductor module according to a third embodiment of the present invention will be described with reference to FIGS. 13 to 15. A difference from the first embodiment will be mainly described. FIG. 13 is a front view of the semiconductor module according to the present embodiment. FIG. 14 is a top view of the semiconductor module according to the present embodiment. FIG. 15 is an enlarged cross-sectional view of an XV portion in FIG. 13 of the semiconductor module according to the present embodiment taken along line XV-XV in FIG. 14.

As shown in FIGS. 13, 14 and 15, similarly to the semiconductor module according to the first embodiment, the semiconductor module according to the present embodiment mainly has substrate 1, joining member 2, semiconductor element 3, joining member 5, conductor 6, joining member 7, and wire 8.

As shown in FIGS. 13 and 14, an area of conductor 6 is smaller than an area of semiconductor element 3 when conductor 6 and semiconductor element 3 are viewed from above. That is, in a top view, conductor 6 is smaller in area than semiconductor element 3. In other words, an area of an upper surface of conductor 6 is smaller than an area of an upper surface of semiconductor element 3. Specifically, a vertical width of conductor 6 is smaller than a vertical width of semiconductor element 3, and a horizontal width of conductor 6 is smaller than a horizontal width of semiconductor element 3.

As shown in FIG. 15, when conductor 6 has groove 6a, groove 6a has, in a cross-sectional view, such a shape that a depth of a central portion (inner portion) of groove 6a is deep and a depth of an end of groove 6a is shallow along a direction in which wire 8 passes over surface electrode 4. That is, conductor 6 has such a shape that the depth of the end of groove 6a is shallower than the depth of the central portion of groove 6a along the direction in which wire 8 passes over surface electrode 4. The depth of each of both ends of groove 6a may be shallower than the depth of the central portion of groove 6a.

A process of manufacturing the semiconductor module according to the present embodiment is similar to the process of manufacturing the semiconductor module according to the first embodiment.

Next, an effect of the semiconductor module according to the present embodiment will be described. An effect that has not been described in the effects of the semiconductor modules according to the first embodiment and the second embodiment will now be described.

In the semiconductor module according to the present embodiment, the area of conductor 6 is smaller than the area of semiconductor element 3 when conductor 6 and semiconductor element 3 are viewed from above. Therefore, an insulation distance between conductor pattern 1b and wire 8, which is subjected to a high voltage and requires maintenance of insulation, can be ensured.

In addition, in the semiconductor module according to the present embodiment, the depth of the end of groove 6a is shallower than the depth of the central portion of groove 6a along the direction in which wire 8 passes over surface electrode 4. Therefore, the insulation distance between conductor pattern 1b and wire 8, which is subjected to a high voltage and requires maintenance of insulation, can be ensured.

Fourth Embodiment

In the present embodiment, the semiconductor module according to any one of the above-described first to third embodiments is applied to a power conversion apparatus. Although the present invention is not limited to a particular power conversion apparatus, description will be given as a fourth embodiment of the case in which the present invention is applied to a three-phase inverter.

Figure 16:
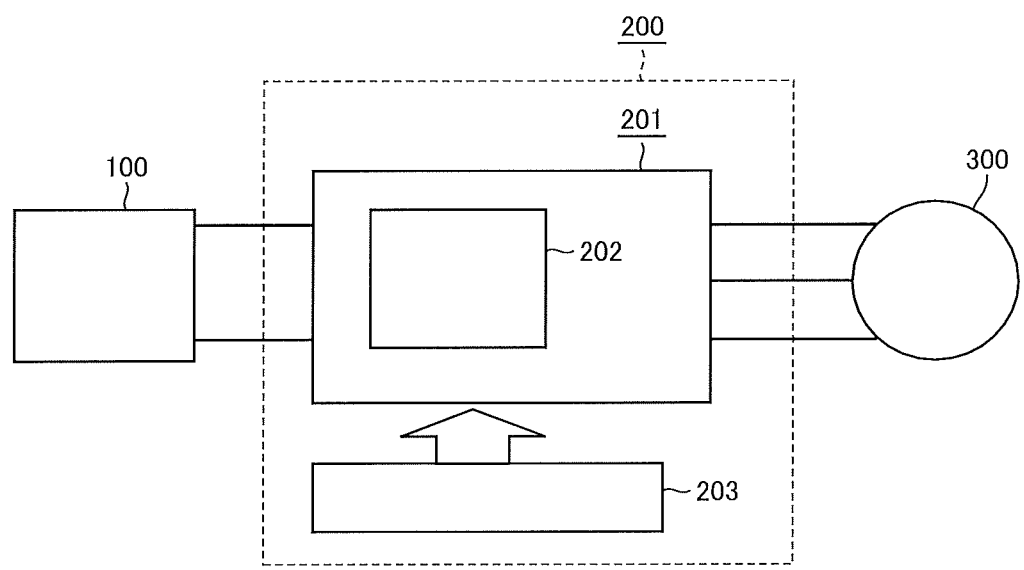
FIG. 16 is a block diagram showing a configuration of a power conversion system to which a power conversion apparatus according to a fourth embodiment of the present invention is applied.

FIG. 16 is a block diagram showing a configuration of a power conversion system to which a power conversion apparatus according to the present embodiment is applied.

The power conversion system shown in FIG. 16 is formed of a power supply 100, a power conversion apparatus 200 and a load 300. Power supply 100 is a DC power supply, and is configured to supply DC power to power conversion apparatus 200. Power supply 100 can be formed by various components. Power supply 100 can be formed by, for example, a DC system, a solar battery or a storage battery, or may be formed by a rectifier circuit or an AC/DC converter connected to an AC system. Alternatively, power supply 100 may be formed by a DC/DC converter configured to convert DC power output from a DC system to prescribed power.

Power conversion apparatus 200 is a three-phase inverter connected between power supply 100 and load 300, and is configured to convert DC power supplied from power supply 100 to AC power and supply the AC power to load 300. As shown in FIG. 16, power conversion apparatus 200 includes a main conversion circuit 201 configured to convert the DC power to the AC power and output the AC power, and a control circuit 203 configured to output a control signal for controlling main conversion circuit 201 to main conversion circuit 201.

Load 300 is a three-phase motor driven by the AC power supplied from power conversion apparatus 200. Load 300 is not limited to a particular application, and is a motor mounted on various types of electric devices. For example, load 300 may be used as a motor for a hybrid vehicle, an electric vehicle, a railroad vehicle, an elevator, or an air conditioner.

The details of power conversion apparatus 200 will be described below. Main conversion circuit 201 includes a switching element and a freewheeling diode (not shown), and the switching element is switched to thereby convert the DC power supplied from power supply 100 to the AC power and supply the AC power to load 300. Although main conversion circuit 201 has various specific circuit configurations, main conversion circuit 201 according to the present embodiment is a two-level three-phase full-bridge circuit and can be formed of six switching elements and six freewheeling diodes connected in antiparallel to the respective switching elements. Each switching element and each freewheeling diode of main conversion circuit 201 are formed by a semiconductor module 202 corresponding to any one of the above-described first to third embodiments. Two of the six switching elements are connected in series to form upper and lower arms, and each set of the upper and lower arms forms each phase (a U phase, a V phase and a W phase) of the full-bridge circuit. Output terminals of the respective sets of the upper and lower arms, i.e., three output terminals of main conversion circuit 201, are connected to load 300.

In addition, main conversion circuit 201 includes a driving circuit (not shown) configured to drive each switching element. The driving circuit may be built into semiconductor module 202, or may be provided separately from semiconductor module 202. The driving circuit generates a driving signal for driving each switching element of main conversion circuit 201 and supplies the driving signal to a control electrode of each switching element of main conversion circuit 201. Specifically, in accordance with the control signal from control circuit 203 described below, the driving circuit outputs a driving signal for turning on each switching element and a driving signal for turning off each switching element to the control electrode of each switching element. When the switching element is maintained in an ON state, the driving signal is a voltage signal (ON signal) that is equal to or higher than a threshold voltage of the switching element. When the switching element is maintained in an OFF state, the driving signal is a voltage signal (OFF signal) that is equal to or lower than the threshold voltage of the switching element.

Control circuit 203 controls each switching element of main conversion circuit 201 such that desired electric power is supplied to load 300. Specifically, based on the electric power to be supplied to load 300, the time period (ON time period) during which each switching element of main conversion circuit 201 should be ON is calculated. For example, main conversion circuit 201 can be controlled by PWM control for modulating the ON time period of each switching element in accordance with a voltage to be output. A control command (control signal) is output to the driving circuit included in main conversion circuit 201, such that an ON signal is output to the switching element to be turned on and an OFF signal is output to the switching element to be turned off at each point of time. In accordance with the control signal, the driving circuit outputs the ON signal or the OFF signal to the control electrode of each switching element as the driving signal.

In the power conversion apparatus according to the present embodiment, the semiconductor module according to any one of the first to third embodiments is applied as each switching element and each freewheeling diode of main conversion circuit 201. Therefore, a long life of the power conversion apparatus can be achieved and a low current density per wire of the semiconductor module can be achieved.

Although the present embodiment has been described in connection with the example in which the present invention is applied to the two-level three-phase inverter, the present invention is not limited thereto and is applicable to various power conversion apparatuses. Although the two-level power conversion apparatus is used in the present embodiment, a three-level or multi-level power conversion apparatus may be used, or the present invention may be applied to a single-phase inverter when electric power is supplied to a single-phase load. When electric power is supplied to a DC load or the like, the present invention is also applicable to a DC/DC converter or an AC/DC converter.

In addition, the power conversion apparatus to which the present invention is applied is not limited to the case in which the above-described load is a motor. For example, the power conversion apparatus to which the present invention is applied can also be used as a power supply apparatus of a discharge processing machine, a laser processing machine, an induction heating cooker, or a wireless power feeding system. Furthermore, the power conversion apparatus to which the present invention is applied can also be used as a power conditioner of a photovoltaic system, a power storage system or the like.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST 1 substrate; 1a, 1b, 1c, 1e conductor pattern; 2 joining member; 3 semiconductor element; 4 surface electrode; 5 joining member; 6 conductor; 7 joining member; 8 wire; 8a both ends; 9 joining member; 10 base plate; 11 joining member; 12 conductor; 13 joining member; 14 wire; 100 power supply; 200 power conversion apparatus; 201 main conversion circuit; 202 semiconductor module; 203 control circuit; 300 load.

The invention claimed is:

1. A semiconductor module comprising:
a substrate;
a semiconductor element joined onto the substrate and having a surface electrode;
a wire, both ends of the wire being bonded to the substrate such that the wire passes over the surface electrode of the semiconductor element;
a conductor joined onto the surface electrode; and
a joining member arranged on the conductor and having electrical conductivity,
the wire being electrically connected to the surface electrode by the conductor and the joining member, the wire being separated from the conductor and embedded in the joining member.

2. The semiconductor module according to claim 1, wherein
the substrate includes an insulating layer and a conductor pattern provided on the insulating layer,
the conductor pattern includes a first conductor portion and a second conductor portion,
the semiconductor element is arranged between the first conductor portion and the second conductor portion, and
a first end of the both ends of the wire is bonded to the first conductor portion, and a second end of the both ends of the wire is bonded to the second conductor portion.

3. The semiconductor module according to claim 1, wherein
the joining member is a silver-containing sintered material.

4. The semiconductor module according to claim 1, wherein
an area of the conductor is smaller than an area of the semiconductor element when the conductor and the semiconductor element are viewed from above.

5. The semiconductor module according to claim 1, wherein
the wire is made of copper.

6. A power conversion apparatus comprising:
a main conversion circuit having the semiconductor module as recited in claim 1, and configured to convert input electric power and output the electric power; and
a control circuit configured to output a control signal for controlling the main conversion circuit to the main conversion circuit.

7. A semiconductor module comprising:
a substrate;
a semiconductor element joined onto the substrate and having a surface electrode;
a wire, both ends of the wire being bonded to the substrate such that the wire passes over the surface electrode of the semiconductor element, the wire being electrically connected to the surface electrode;
a conductor joined onto the surface electrode; and
a joining member arranged on the conductor and having electrical conductivity,
the wire being joined by the conductor and the joining member,
the conductor including a groove provided in an upper surface,
the wire and the joining member being arranged to enter the groove.

8. The semiconductor module according to claim 7, wherein
the groove has such a shape that a depth of an end of the groove is shallower than a depth of a central portion of the groove along a direction in which the wire passes over the surface electrode.

9. A method for manufacturing a semiconductor module, the method comprising:
bonding both ends of a wire to a substrate such that the wire passes over a surface electrode of a semiconductor element joined onto the substrate;
electrically connecting the wire bonded to the substrate to the surface electrode of the semiconductor element;
joining a conductor onto the surface electrode, the conductor including a groove in an upper surface; and
pushing the wire into the groove, and then, joining the conductor and the wire in the groove by a joining member having electrical conductivity.

* * * * *